US009761302B1

(12) United States Patent
Lu et al.

(10) Patent No.: US 9,761,302 B1
(45) Date of Patent: Sep. 12, 2017

(54) STATIC RANDOM ACCESS MEMORY CELL AND MANUFACTURING METHOD THEREOF

(71) Applicant: UNITED MICROELECTRONICS CORP., Hsin-Chu (TW)

(72) Inventors: Tien-Yu Lu, Taichung (TW); Chang-Hung Chen, Tainan (TW); Chun-Hsien Huang, Tainan (TW); Han-Tsun Wang, Tainan (TW); Jheng-Tai Yan, Yunlin County (TW); Yu-Tse Kuo, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/092,613

(22) Filed: Apr. 6, 2016

(51) Int. Cl.
*G11C 11/34* (2006.01)
*G11C 11/417* (2006.01)
*G11C 11/412* (2006.01)
*H01L 27/105* (2006.01)

(52) U.S. Cl.
CPC ......... *G11C 11/417* (2013.01); *G11C 11/412* (2013.01); *H01L 27/105* (2013.01)

(58) Field of Classification Search
CPC ....... G11C 11/412; G11C 8/16; G11C 11/417; H01L 27/105
USPC ........................................................ 365/156
See application file for complete search history.

(56) References Cited

U.S. PATENT DOCUMENTS

| 5,504,705 | A | * | 4/1996 | Ohkubo | H01L 27/1108 257/E27.098 |
|---|---|---|---|---|---|
| 5,572,480 | A | * | 11/1996 | Ikeda | H01L 27/1104 257/324 |
| 8,908,421 | B2 | | 12/2014 | Liaw | |
| 8,942,030 | B2 | | 1/2015 | Liaw | |
| 8,976,576 | B2 | * | 3/2015 | Chen | G11C 8/16 365/154 |
| 2011/0317485 | A1 | * | 12/2011 | Liaw | H01L 27/11 365/182 |
| 2014/0078817 | A1 | * | 3/2014 | Bentum | G11C 11/412 365/154 |
| 2014/0347917 | A1 | * | 11/2014 | Chen | G11C 8/16 365/156 |
| 2015/0078068 | A1 | * | 3/2015 | Bentum | G11C 11/412 365/154 |

OTHER PUBLICATIONS

Wang et al., Title of Invention: Layout Pattern for SRAM and Manufacturing Methods Thereof, U.S. Appl. No. 15/088,122, filed Apr. 1, 2016.

* cited by examiner

*Primary Examiner* — Richard Elms
*Assistant Examiner* — Xiaochun L Chen
(74) *Attorney, Agent, or Firm* — Winston Hsu

(57) ABSTRACT

A SRAM cell includes a first pass-gate device and a second-pass gate device comprising a first conductivity type, a first pull-down device and a second pull-down device comprising the first conductivity type, and a first pull-up device and a second pull-up device comprising a second conductivity type complementary to the first conductivity type. The first pass-gate device and the second pass-gate device respectively include first lightly-doped drains (hereinafter abbreviated as LDDs. The first pull-down device and the second pull-down device respectively include second LDDs. And a dosage of the first LDDs is different from a dosage of the second LDDs.

19 Claims, 9 Drawing Sheets

US 9,761,302 B1

STATIC RANDOM ACCESS MEMORY CELL AND MANUFACTURING METHOD THEREOF

BACKGROUND OF THE INVENTION

1. Field of the Invention

The present invention relates to a static random access memory (hereinafter abbreviated as SRAM) cell and a manufacturing method thereof, and more particularly, to a SRAM cell with beta ratio larger than 1 and a manufacturing method thereof.

2. Description of the Prior Art

In recent years, with widespread use of mobile terminal equipment, digital signal processing in which bulk data such as sounds or images is processed at high speed has been increasingly important. SRAM, which is capable of high-speed access processing, holds an important place as a semiconductor memory device to be mounted on such mobile terminal equipment.

Each of SRAM cells include a bistable circuit, which does not require refreshing. The switching speed of each bistable circuit is determined by the resistance and capacitance of the control electrodes of the transistors and the connection of the transistors within the circuit, thereby determining the slew rate of its output voltage. In a conventional six-transistor SRAM (hereinafter abbreviated as 6T-SRAM) cell including two pull-up transistors, two pull-down transistors, and two access transistors. One of the pull-up transistors and one of the pull-down transistors are electrically connected in series to constitute an inverter. The ratio of the conductance of the inverters to the conductance of the pass-gates of a SRAM cell is a basic metric used to measure the stability of the cell, i.e., the ability of the SRAM cell to retain its data state. This ratio is referred as the beta (β) ratio of the SRAM cell. The larger the beta ratio is, the more stable the cells are. Since the beta ratio of an SRAM cell can be approximated by the ratio of $\mu_{eff}(W/L)$ of gate of the pull-down transistor to $\mu_{eff}(W/L)$ of the pass-gate of the accesses transistor, same width and length dimension of gates of the pull down transistors and pass-gates of the access transistors let beta ratio close to 1. And it is also found that current crowding and low speed in such SRAM cell.

SUMMARY OF THE INVENTION

According to an aspect of the present invention, a SRAM cell is provided. The SRAM cell includes a first pass-gate device and a second-pass gate device comprising a first conductivity type, a first pull-down device and a second pull-down device comprising the first conductivity type, and a first pull-up device and a second pull-up device comprising a second conductivity type complementary to the first conductivity type. The first pass-gate device and the second pass-gate device respectively include first lightly-doped drains (hereinafter abbreviated as LDDs. The first pull-down device and the second pull-down device respectively include second LDDs. And a dosage of the first LDDs is different from a dosage of the second LDDs.

According to an aspect of the present invention, a method for manufacturing a SRAM cell is provided. The method includes following steps: A substrate is provided. The substrate includes a plurality of active regions formed thereon, and the active regions are extended along a first direction and arranged along a second direction. Then, a plurality of gate layers crossing the active regions to define at least a first pull-up device, a second pull-up device, a first pull-down device, a second pull-down device, a first pass-gate device and a second pass-gate device are formed. After forming the gate layers, a first LDD doping is performed to the first pass-gate device and the second pass gate device, and the first LDD doping includes a first conductivity type. Next, a second LDD doping is performed to the first pull-down device and the second pull-down device, the second LDD doping includes the first conductivity type. More important, a dosage of the second LDD doping is equal to or larger than a dosage of the first LDD doping.

According to the SRAM cell and the manufacturing method provided by the present invention, two LDD dopings including equal or different dosages are performed to form the first LDDs for the first pass-gate device and the second pass-gate device and the second LDDs for the first pull-down device and the second pull-down device. And thus a dosage of the first LDDs is different from a dosage of the second LDDs. By making the dosage of the second LDDs larger than the dosage of the first LDDs, a threshold voltage of the first pull-down device and the second pull-down device is lower than a threshold voltage of the first pass-gate device and the second pass-gate device, and thus a current of the pull-down devices is higher than a current of the pass-gate devices. As a result, the beta ratio of current of the pull-down devices to current of the pass-gate devices is larger than 1. And thus stability and speed of the SRAM cell are improved while the current crowding is diminished.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

It will be understood that when an element is referred to as being "formed" on another element, it can be directly or indirectly, formed on the given element by growth, deposition, etch, attach, connect, or couple. And it will be understood that when an elements or a layer is referred to as being "on", "connected to", or "coupled to" another element or layer, it can be directly on, connected or coupled to the other element or layer or intervening elements or layers may be present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer and/or section from another. Thus, a first element, component, region, layer or section discussed below could be termed a second element, component, region, layer or section without departing from the teachings of the disclosure.

Spatially relative terms, such as "beneath", "below", "lower", "above", "upper", "in", "on" and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "below" or "beneath" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to be limiting of the inventions. As used herein, the singular form "a", "an" and "the" are intended to include the plural forms as well, unless the context clearly indicates otherwise.

It should be noted that slash "/" recited in the following description is referred to "and" for simplifying.

Figure 1:
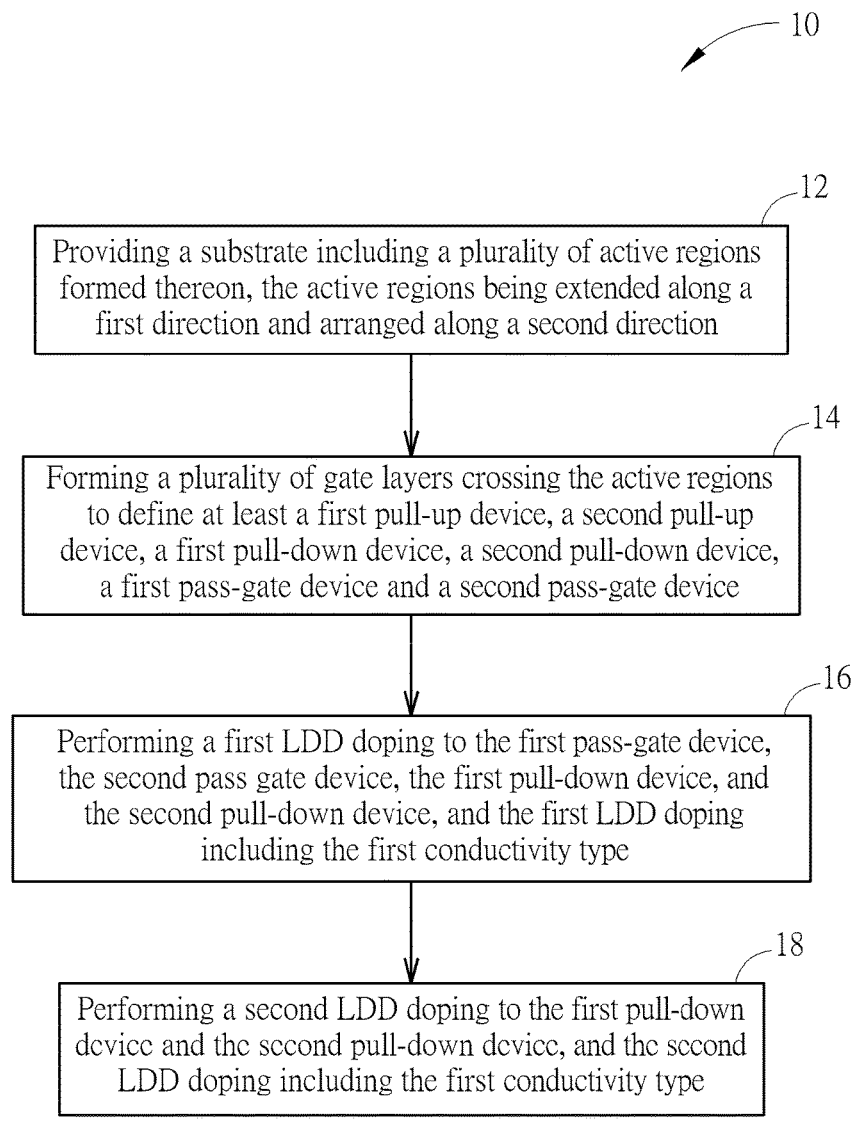
FIG. 1 is a flow chart of a method for manufacturing a SRAM cell provided by a preferred embodiment of the present invention.

Please refer to FIG. 1, which is a flow chart of a method for manufacturing a SRAM cell provided by a preferred embodiment of the present invention. As shown in FIG. 1, the method for manufacturing a SRAM cell 10 includes a STEP 12:

STEP 12: Providing a substrate including a plurality of active regions formed thereon, the active regions being extended along a first direction and arranged along a second direction.

According to the method for manufacturing the SRAM cell 10 provided by the preferred embodiment, a substrate is provided. The substrate can include a silicon-on-insulator (hereinafter abbreviated as SOI) substrate. It is well-known to those skilled in the art that the SOI substrate upwardly includes a silicon substrate, a bottom oxide (BOX) layer, and a semiconductor layer such as a single crystalline silicon layer formed on the BOX layer. Additionally, the substrate also can include a bulk silicon substrate. Furthermore, in some embodiments of the present invention, the substrate may include another elementary semiconductor, such as germanium (Ge); a compound semiconductor including silicon carbide (SiC), gallium arsenic (GaAs), gallium phosphide (GaP), indium phosphide (InP), indium arsenide (InAs), and/or indium antimonide (InSb); an alloy semiconductor including SiGe, GaAsP, AlInAs, AlGaAs, GaInAs, GaInP, and/or GaInAsP; or combinations thereof.

The substrate includes a plurality of active regions formed thereon. It should be noted that conventional planar MOS transistor has difficulty when scaling down to 65 nm and beyond. Therefore the non-planar transistor technology such as Fin Field effect transistor (hereinafter abbreviated as FinFET) technology that allows smaller size and higher performance is developed to replace the planar transistor. Accordingly, the method provided by the preferred embodiments is exemplarily provided to form IC structure including non-planar FET device such as FinFET device, but not limited to this. Accordingly, the active regions provided by the preferred embodiments can be preferably fin structures as shown in FIGS. 4-9. And the fin structures (the active regions) are extended along a first direction D1 and arranged along a second direction D2 as shown in FIGS. 4-9. In some embodiments of the present invention the first direction D1 and the second direction D2 are perpendicular to each other, but not limited to this. Furthermore, the active regions (fin structures) can include a plurality of first active regions and a plurality of second active regions. It is noteworthy that channel dopings can be performed to the active regions such that the first active regions can include a first conductivity type and the second active regions can include a second conductivity type. The second conductivity type is complementary to the first conductivity type. In the preferred embodiment, the first conductivity type is an n type and the second conductivity type is p type. And thus dosages of the first active regions are the same, and dosages of the second active region are the same.

As shown in FIG. 1, the method for manufacturing a SRAM cell 10 further includes a STEP 14 after STEP 12:

STEP 14: Forming a plurality of gate layers crossing the active regions to define at least a first pull-up device, a second pull-up device, a first pull-down device, a second pull-down device, a first pass-gate device and a second pass-gate device.

Conventionally, the pull-up devices of the SRAM cell are p-type metal oxide semiconductor (pMOS) transistors while the pull-down devices and the pass-gate devices are n-type metal oxide semiconductor (nMOS) transistors. Therefore, the gate layers formed on the second active regions including the second conductivity type define the n-typed first/second pull-down devices and the n-typed first/second pass-gate devices while the gate layers formed on the first active regions including the first conductivity type define the p-typed first/second pull-up devices.

According to the preferred embodiment, the gate layers respectively include a gate dielectric layer (not shown) and a gate conductive layer (not shown). The gate dielectric layer includes the conventional dielectric material such as silicon oxide (SiO), silicon nitride (SiN), or silicon oxynitride (SiON). In some embodiments of the present invention, the gate dielectric layer can include high-K dielectric material such as hafnium oxide (HfO), hafnium silicate (HfSiO), or metal oxide or metal silicate exemplarily of aluminum (Al), zirconium (Zr), lanthanum (La), but not limited to this. In addition, when the gate dielectric layer includes the high-K dielectric material, the embodiments of the present invention can be further integrated to the metal gate process. Therefore control gate compatible to the high-K gate dielectric layer is obtained. Accordingly, the gate conductive layer can include different materials according to the gate-first or gate-last process. In some embodiments of the present invention which is integrated with gate-first process, the gate conductive layer includes metal such as tantalum (Ta), titanium (Ti), ruthenium (Ru), molybdenum (Mo), alloys of the aforementioned metals, metal nitride such as tantalum nitride (TaN), titanium nitride (TiN), molybdenum nitride (MoN), or metal carbide such as tantalum carbide (TaC). It is noteworthy that the metals are chosen by providing proper work function to the multi-gate transistors of different conductivity types. And the gate conductive layer can be a single-layered or multi-layered structure. In some embodiments of the present invention which is integrated with the gate-last process, the gate conductive layer serves as a dummy gate and includes semiconductor material such as polysilicon.

As shown in FIG. 1, the method for manufacturing a SRAM cell 10 includes a STEP 16 after STEP 14:

STEP 16: Performing a first LDD doping to the first pass-gate device, the second pass-gate device, the first pull-down device, and the second pull-down device, and the first LDD doping including the first conductivity type.

According to the preferred embodiment, the first conductivity type is n type, therefore the first LDD doping is referred to a first NLDD doping. It is well-known that the first/second pull-up devices are protected from the first NLDD doping. The first NLDD doping can includes arsenic (As), but not limited to this. Furthermore, a dosage of the first LDD doping can be approximately 1E14-1E15, but not limited to this.

As shown in FIG. 1, the method for manufacturing a SRAM cell 10 includes a STEP 18 after STEP 16:

STEP 18: Performing a second LDD doping to the first pull-down device and the second pull-down device, and the second LDD doping including the first conductivity type.

As mentioned above, the first conductivity type is n type, therefore the second LDD doping is referred to a second NLDD doping. It is well-known that the first/second pull-up devices are protected from the second NLDD doping. However, the first/second pass-gate devices are also protected from the second NLDD doping in accordance with the preferred embodiment. The second NLDD can include As, but not limited to this. Furthermore, a dosage of the second LDD doping is equal to the dosage of the first LDD doping in the preferred embodiment. Accordingly, the dosage of the second LDD doping can be approximately 1E14-1E15, but not limited to this.

Additionally, in a modification to method for manufacturing the SRAM cell 10, the second LDD doping can include a solid phase diffusion. Accordingly, phosphorous (P) are diffused from a phosphosilicate glass (PSG) which is commonly used in semiconductor device fabrication in inter-metal layers.

After sequentially performing the first NLDD doping the second NLDD doping, a PLDD doping can be performed and followed by suitable anneal treatment, and thus to form first LDDs for the first/second pass-gate devices, to form second LDDs for the first/second pull-down devices, and to form third LDDs for the first/second pull-up devices. It is noteworthy that since both of the first LDD doping and the second LDD doping are involved in the second LDD formation, a dosage of the second LDDs is different from, specifically larger than a dosage of the first LDDs. Additionally, after forming the first LDDs, the second LDDs and the third LDDs, elements such as spacers, and source/drain are formed and thus FinFET devices, that is, non-planar transistors are obtained. It should be easily realized by those skilled in the art that in some embodiments of the present invention, a selective epitaxial growth (hereinafter abbreviated as SEG) and/or salicide process can be integrated in the FinFET fabrication processing, and those details are omitted in the interest of brevity. In those embodiments integrated with gate-last process, the gate conductive layer of the gate layers can be removed after forming the abovementioned elements and replaced with the required metal gates. Consequently, a SRAM cell including the n-typed first/second pull-down devices, the n-typed first/second pass-gate devices, and the p-typed first/second pull-up devices is obtained.

Thereafter, required contact plugs and interconnection structures are built for providing electrical connections for the SRAM cell. It is well-know that SRAM memory cell(s) and arrays are fabricated by forming metal contacts such as word line contacts, bit line contacts, VSS contacts and VCC contacts, etc., over transistors to electrically connect these SRAM cells and arrays together and ensure normal read and write operations. Consequently, word line contacts electrically connected to higher interconnect layer (s) such as first metal (M1) layer of an interconnection structure; bit line contacts electrically connected to the higher interconnect layer(s) such as M1, first via (V1) layer and second metal layer (M2) of the interconnection structure are formed, and those details are omitted hereinafter.

According to the method for manufacturing the SRAM cell 10 provided by the preferred embodiment, an additional LDD doping, that is the second LDD doping is provided to the first/second pull-down devices. In other words, two LDD dopings including the same dosage is involved in the LDD formation for the first/second pull-down devices, and thus the dosage of the second LDDs of the first/second pull-down devices is different from the dosage of the first LDDs of the first/second pass-gate devices. Specifically, the dosage of the second LDDs of the first/second pull-down devices is larger than the dosage of the first LDDs of the first/second pass-gate devices. Consequently, threshold voltages of the first/second pull-down devices are lower than threshold voltages of the first/second pass-gate devices, and thus a current of the first/second pull-down devices is higher than a current of the first/second pass-gate devices. As a result, the beta ratio of current of the pull-down devices to current of the pass-gate devices is larger than 1. And thus stability and speed of the SRAM cell are improved while the current crowding is diminished.

Figure 2:
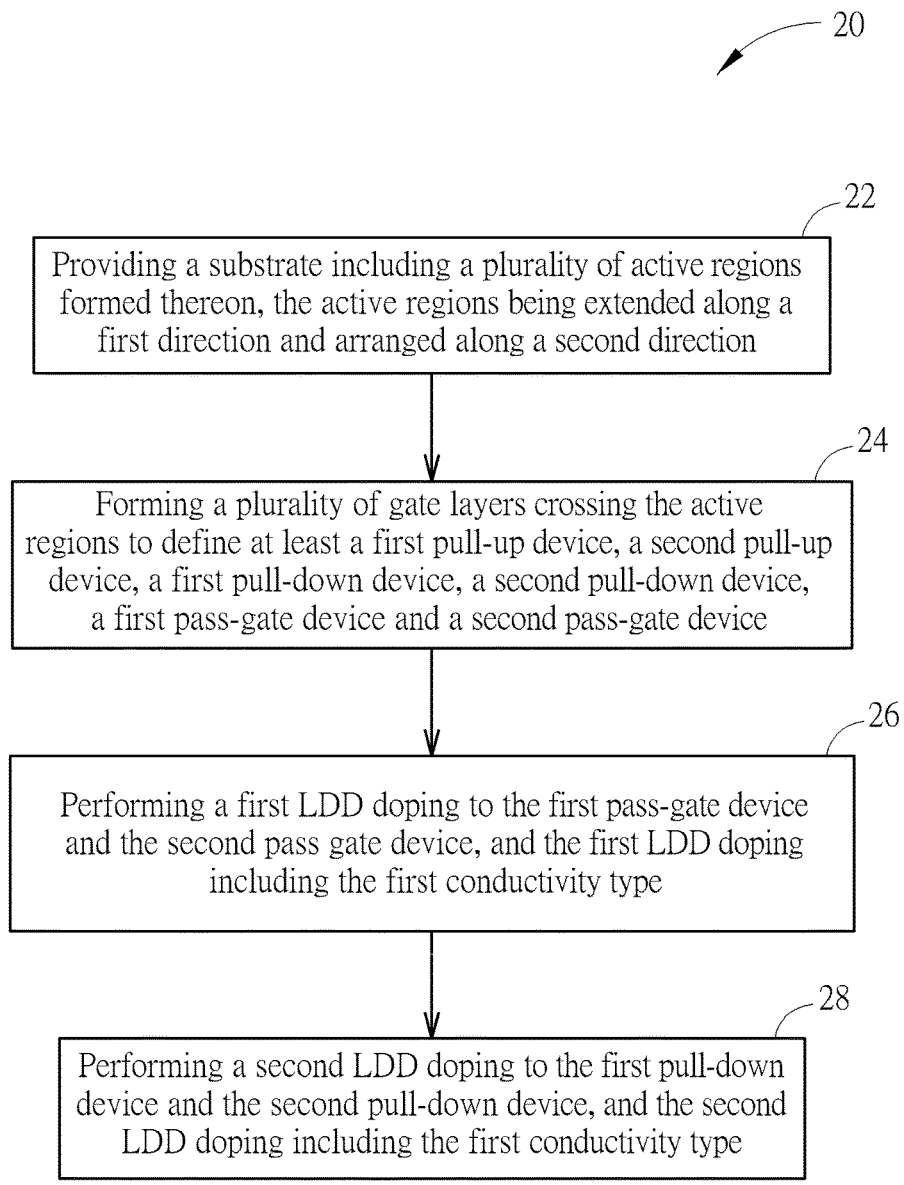
FIG. 2 is a flow chart of a method for manufacturing a SRAM cell provided by another preferred embodiment of the present invention.

Please refer to FIG. 2, which is a flow chart of a method for manufacturing a SRAM cell provided by another preferred embodiment of the present invention. It is noteworthy that elements the same in the first and second preferred embodiment can include the same material and thus those details are omitted in the interest of brevity. As shown in FIG. 2, the method for manufacturing a SRAM cell 20 includes a STEP 22:

STEP 22: Providing a substrate including a plurality of active regions formed thereon, the active regions being extended along a first direction and arranged along a second direction.

As mentioned above, the method provided by the preferred embodiment is exemplarily provided to form IC structure including non-planar FET device such as FinFET device, but not limited to this. Accordingly, the active regions provided by the preferred embodiments can be preferably fin structures as shown in FIGS. 4-9. And the fin structures (the active regions) are extended along a first direction D1 and arranged along a second direction D2 as shown in FIGS. 4-9. Furthermore, the active regions (fin structures) can include a plurality of first active regions and a plurality of second active regions. The first active regions include a first conductivity type, the second active regions include a second conductivity type, and the second conductivity type is complementary to the first conductivity type. In the preferred embodiment, the first conductivity type is an n type and the second conductivity type is p type. It is noteworthy that dosages of the first active regions are the same, and dosages of the second active region are the same.

As shown in FIG. 2, the method for manufacturing a SRAM cell 20 further includes a STEP 24 after STEP 22:

STEP 24: Forming a plurality of gate layers crossing the active regions to define at least a first pull-up device, a second pull-up device, a first pull-down device, a second pull-down device, a first pass-gate device and a second pass-gate device.

Conventionally, the pull-up devices of the SRAM cell are pMOS transistors while the pull-down devices and the pass-gate devices are nMOS transistors. Therefore, the gate layers formed on the second active regions define the n-typed first and second pull-down devices and the n-typed first and second pass-gate devices while the gate layers formed on the first active regions define the p-typed first and second pull-up devices.

As shown in FIG. 2, the method for manufacturing a SRAM cell 20 includes a STEP 26 after STEP 24:

STEP 26: Performing a first LDD doping to the first pass-gate device and the second pass-gate device, and the first LDD doping including the first conductivity type.

According to the preferred embodiment, the first conductivity type is n type, therefore the first LDD doping is referred to a first NLDD doping. It is well-known that the first/second pull-up devices are protected from the first NLDD doping. The first NLDD doping can includes As, but not limited to this. Furthermore, a dosage of the first LDD doping can be approximately 1E14-1E15, but not limited to this. It is noteworthy that in the preferred embodiment, the first pull-down device and the second pull-down device are also protected from the first NLDD doping. In other words, only the first and second pass-gate devices are involved.

As shown in FIG. 2, the method for manufacturing a SRAM cell 20 includes a STEP 28 after STEP 26:

STEP 28: Performing a second LDD doping to the first pull-down device and the second pull-down device, and the second LDD doping including the first conductivity type.

As mentioned above, the first conductivity type is n type, therefore the second LDD doping is referred to a second NLDD doping. It is well-known that the first/second pull-up devices are protected from the second NLDD doping. It is noteworthy that the first pass-gate device and the second pass-gate device are also protected from the second LDD doping. The second NLDD can include As, but not limited to this. Furthermore, a dosage of the second LDD doping is larger than the dosage of the first LDD doping in the preferred embodiment. Accordingly, the dosage of the second LDD doping can be approximately 2E14-2E15, but not limited to this.

In a modification to the method for manufacturing the SRAM 20 provided by the preferred embodiment, the second doping can be replaced with a solid phase diffusion. Accordingly, phosphorous is diffused from a phosphosilicate glass (PSG) layer which is a commonly used in the semiconductor device fabrication for inter-metal layers.

After sequentially performing the first NLDD doping and the second NLDD doping, a PLDD doping can be performed and followed by suitable anneal treatment, and thus to form first LDDs for the first/second pass-gate devices, to form second LDDs for the first/second pull-down devices, and to form third LDDs for the first/second pull-up devices. It is noteworthy that since the first LDD doping is involved in the first LDDs formation and the second LDD doping is involved in the second LDDs formation, individually, a dosage of the second LDDs is different from, specifically larger than a dosage of the first LDDs. Additionally, after forming the first LDDs, the second LDDs and third LDDs, elements such as spacers, and source/drain are formed and thus FinFET devices, that is, non-planar transistors are obtained. It should be easily realized by those skilled in the art that in some embodiments of the present invention, a SEG and/or salicide process can be integrated in the FinFET fabrication processing, and those details are omitted in the interest of brevity. In those embodiments integrated with gate-last process, the gate conductive layer of the gate layers can be removed after forming the abovementioned elements and replaced with the required metal gates. Consequently, a SRAM cell including the n-typed first/second pull-down devices, the n-typed first/second pass-gate devices, and the p-typed first/second pull-up devices is obtained.

Thereafter, required contact plugs and interconnection structures are built for providing electrical connections for the SRAM cell as mentioned above.

According to the method for manufacturing the SRAM cell 20 provided by the preferred embodiment, separate LDD dopings individually for the first/second pass-gate devices and for the first/second pull-down devices are provided. That is, the second LDD doping including the higher dosage is involved in the second LDD formation for the first/second pull-down devices, and thus the dosage of the second LDDs of the first/second pull-down devices is different from the dosage of the first LDDs of the first/second pass-gate devices. Specifically, the dosage of the second LDDs of the first/second pull-down devices is larger than the dosage of the first LDDs of the first/second pass-gate devices. Consequently, threshold voltage of the first/second pull-down devices is lower than a threshold voltage of the first/second pass-gate device, and thus a current of the pull-down devices is higher than a current of the pass-gate devices. As a result, the beta ratio of current of the pull-down devices to current of the pass-gate devices is larger than 1. And thus stability and speed of the SRAM cell are improved while the current crowding is diminished.

Figure 3:
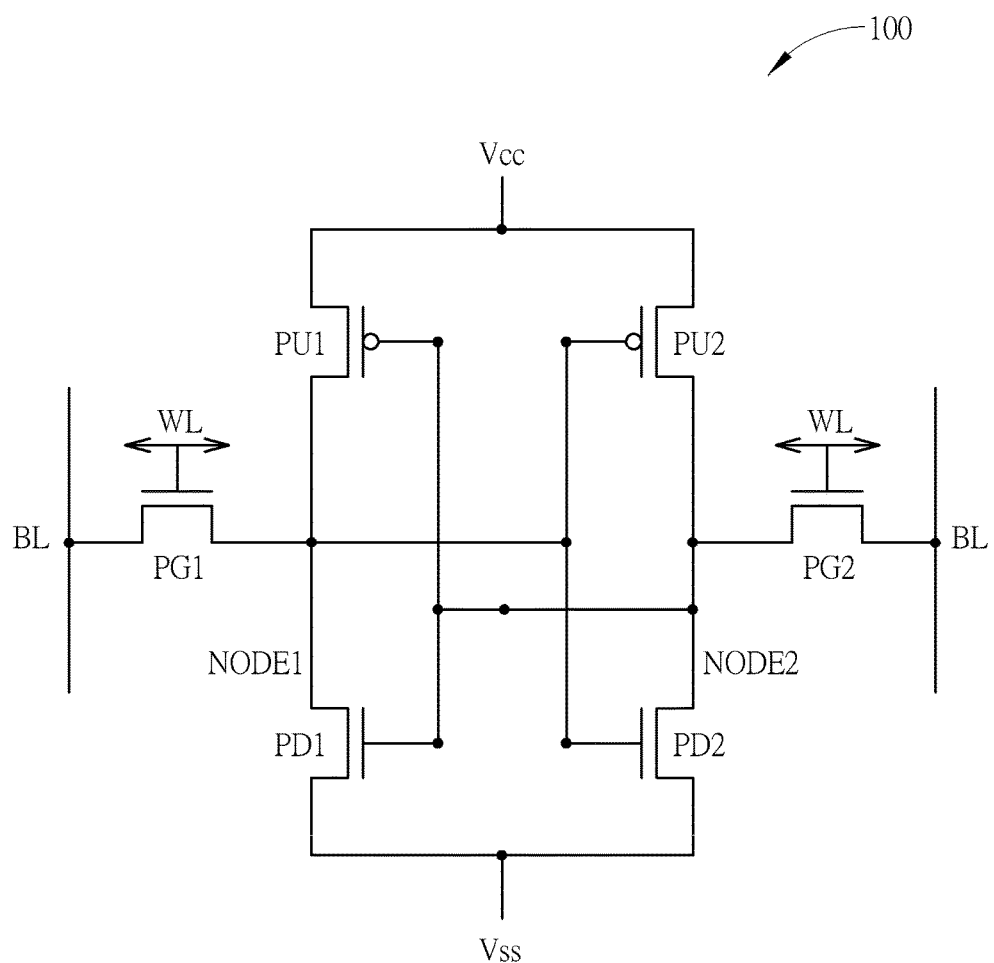
FIG. 3 is a circuit diagram of a 6T-SRAM cell constructed according to various aspects of the present disclosure in a first preferred embodiment.

Please refer to FIG. 3, which is a circuit diagram of a 6T-SRAM cell 100 constructed according to various aspects of the present disclosure in a first preferred embodiment. According to the preferred embodiment, the first pull-up device, the second pull-up device, the first pull-down device, the second pull-down device, the first pass-gate device, and the second pass-gate device construct the 6T-SRAM. The 6T-SRAM cell 100 includes the first pass-gate device PG1 and the second-pass gate device PG2 including the first conductivity type, the first pull-down device PD1 and the second pull-down device PD2 including the first conductivity type, and the first pull-up device PU1 and the second pull-up device PU2 including the second conductivity type. As shown in FIG. 3, the first pull-up device PU1 and the first pull-down device PD1 are electrically connected in series to constitute an inverter. One end of this inverter is electrically connected to a Vcc line and the other end is electrically connected to a Vss line. Equally, the second pull-up device PU2 and the second pull-down device PD2 are electrically connected in series to constitute another inverter. One end of this inverter is electrically connected to the Vcc line and the other end is electrically connected to the Vss line. The drains of the first pull-up device PU1 and the first pull-down device PD1 are electrically connected together to form a first data node NODE1. Equally, the drains of the second pull-up device PU2 and the second pull-down device PD2 are electrically connected together to form a second data node NODE2. The gates of the first and second pass-gate devices PG1/PG2 are electrically connected to a word line WL that determines whether the current SRAM cell is selected or not. The drains of the first and second pass-gate devices PG1/PG2 are electrically connected to a bit line BL. The source of the first pass-gate device PG1 is electrically connected to the first data node NODE1, and the source of the second pass-gate device PG2 is electrically connected to the second data node NODE2, forming a port for data access.

Figure 4:
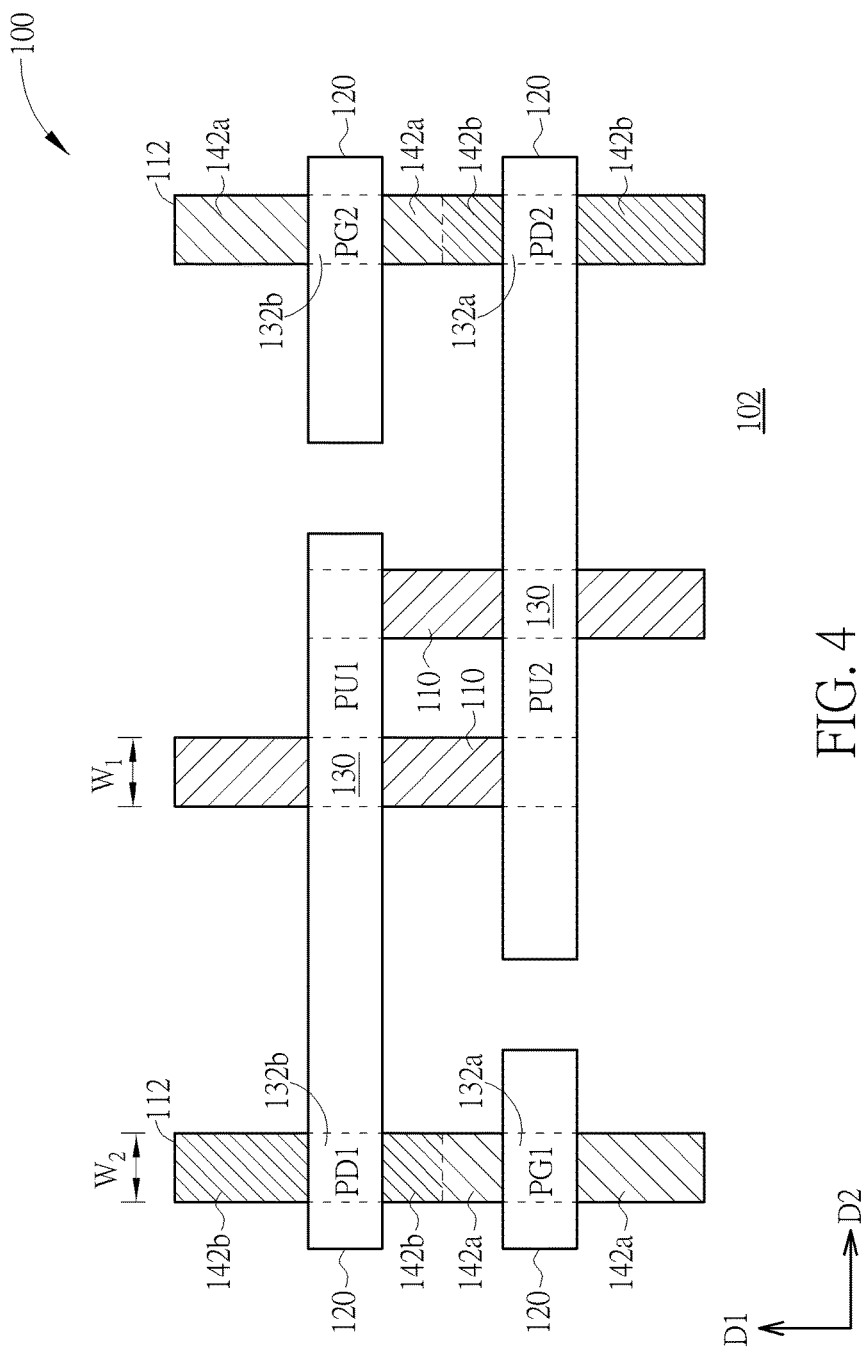
FIG. 4 is a schematic drawing illustrating the 6T-SRAM cell in a step according to the abovementioned methods provided by the present invention.

Please refer to FIG. 4, which is a schematic drawing illustrating the SRAM cell 100 in a step according to the abovementioned methods 10/20 provided by the present invention. According to STEP 12 or STEP 22, the first active regions 110 and the second active regions 112 are formed on the substrate 102. As mentioned above, the first active regions 110 include the first conductivity type and the second active regions 112 include the second conductivity type. In the preferred embodiment, a width $W_1$ of the first active regions 110 and a width $W_2$ of the second active regions 112 are the same. According to STEP 14 or STEP 24, the gate layers 120 are formed on the first active regions 110 to define the first/second pull-up device PU1/PU2, and the gate layers 120 are formed on the second active regions 112 to define the first/second pull-down devices PD1/PD2 and the first/second pass-gate devices PG1/PG2. In other words, a width of active regions 110/112 of the first/second pull-up devices PU1/PU2, the first/second pull-down devices PD1/PD2, and the first/second pass-gate devices PG1/PG2 are all the same. It should be noted that the first/second pull-up device PU1/PU2 respectively include a channel region 130 formed in the first active regions 110 at where the gate layers 120 cover. The first/second pass-gate devices PG1/PG2 respectively include a first channel region 132a formed in the second active regions 112 at where the gate layers 120 cover. And the first/second pull-down devices PD1/PD2 respectively include a second channel region 132b formed in the second active regions 112 at where the gate layers 120 cover. It is noteworthy that dosages of the channel regions 130 of the first/second pull-up devices PU1/PU2 are all the same. And the dosages of the first channel regions 132a of the first/second pass-gate devices PG1/PG2 and the second channel regions 132b of the first/second pull-down devices PD1/PD2 are all the same.

According to STEPS 16-18 or STEPS 26-28, the first pass-gate device PG1 and the second pass-gate device PG2 respectively include the first LDDs 142a while the first pull-down device PD1 and the second pull-down device PD2 respectively include the second LDDs 142b. As mentioned above, the first LDDs 142a of the pass-gate devices PG1/PG2 and the second LDDs 142b of the pull-down devices PD1/PD2 include the same conductivity type, however the dosage of the first LDDs 142a is different from the dosage of the second LDDs 142b. Specifically, the dosage of the second LDDs 142b is larger than the dosage of the first LDDs 142a.

As mentioned above, thereafter, steps for forming elements of the 6T-SRAM cell 100 are performed and electrical connection are built, and those details are omitted for brevity. According to the 6T-SRAM cell 100 provided by the first preferred embodiment, an additional LDD doping is or separate dopings are, performed. And thus the dosage of the second LDDs 142b of the first/second pull-down devices PD1/PD2 is larger than the dosage of the first LDDs 142a of the first/second pass-gate devices PG1/PG2. Consequently, threshold voltages of the first/second pull-down devices PD1/PD2 are lower than threshold voltages of the first/second pass-gate devices PG1/PG2, and thus a current of the first/second pull-down devices PD1/PD2 is higher than a current of the first/second pass-gate devices PG1/PG2. As a result, the beta ratio of current of the pull-down devices PD1/PD2 to current of the pass-gate devices PG1/PG2 is larger than 1. And thus stability and speed of the 6T-SRAM cell 100 are improved while the current crowding is diminished.

Figure 5:
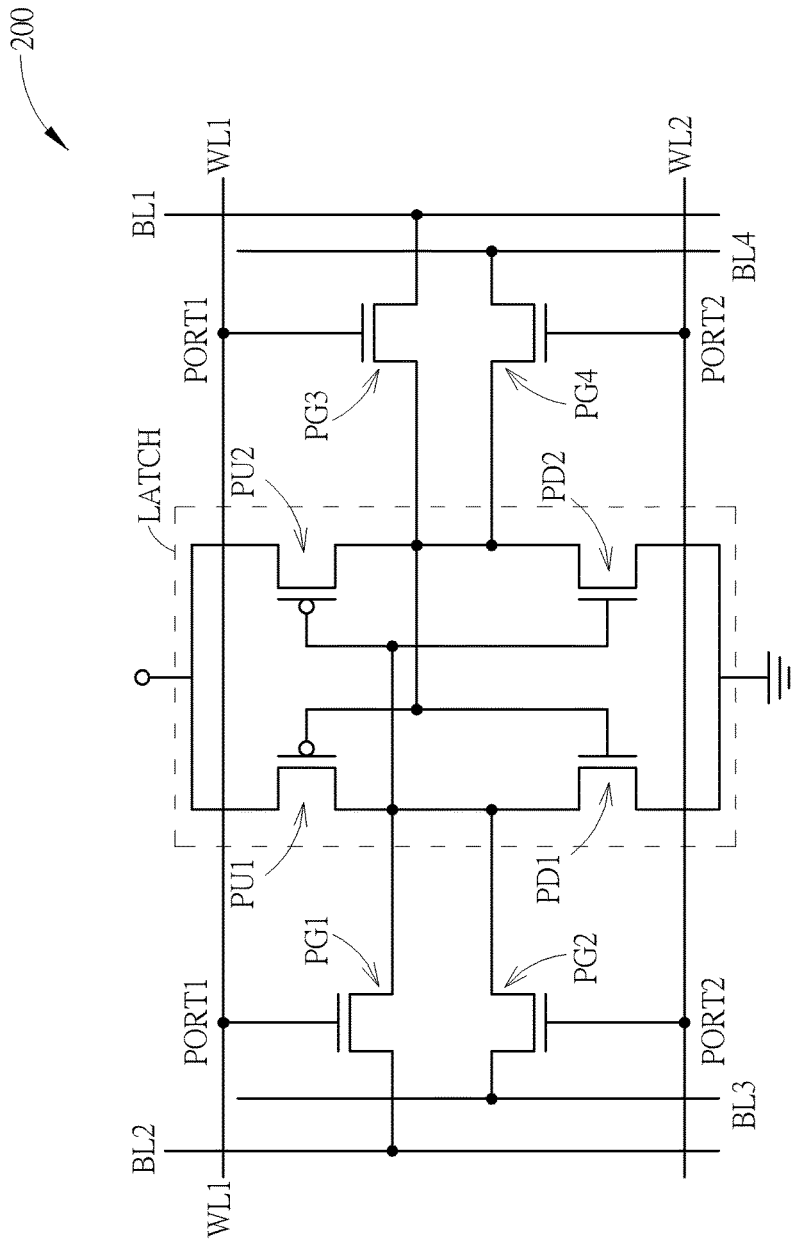
FIG. 5 is a circuit diagram of an 8TDP SRAM cell constructed according to various aspects of the present disclosure in a second preferred embodiment.

Please refer to FIG. 5, which is a circuit diagram of an eight-transistors dual port SRAM (hereinafter abbreviated as 8TDP SRAM) cell 200 constructed according to various aspects of the present disclosure in a second preferred embodiment. According to the preferred embodiment, the first pull-up device, the second pull-up device, the first pull-down device, the second pull-down device, the first pass-gate device, the second pass-gate device, a third pass-gate device and a fourth pass-gate device construct the 8TDP SRAM cell 200. In detail, the 8TDP SRAM cell 200 includes the first pull-down device PD1, the second pull-down device PD2, the first pass-gate device PG1, the second pass-gate device PG2, the third pass-gate device PG3 and the fourth pass-gate device PG4 including the first conductivity type, and the first pull-up device PU1 and the second pull-up device PU2 including the second conductivity type. The first pass-gate device PG1 and the third pass-gate device PG3 form a first port PORT1, the second pass-gate device PG2 and the fourth pass-gate device PG4 form a second port PORT2. The gates of the first/third pass-gate devices PG1/PG3 are controlled by a first word line WL1 while the gates of the second/fourth pass-gate devices PG2/PG4 are controlled by a second word line WL2. A latch (LATCH) formed of first/second pull-up devices PU1/PU2 and the first/second pull-down devices PD1/PD2 stores a bit. The stored bit can be read through the first port PORT1 using bit lines BL1 and BL2, or through the second port PORT2 using bit lines BL3 and BL4. Conversely, a bit can be written into the SRAM cell through either the first port PORT1 or the second port PORT2. With the two ports, the bit stored in the 8TDP SRAM cell 200 can be read from the first port PORT1 and the second port PORT2 simultaneously.

Figure 6:
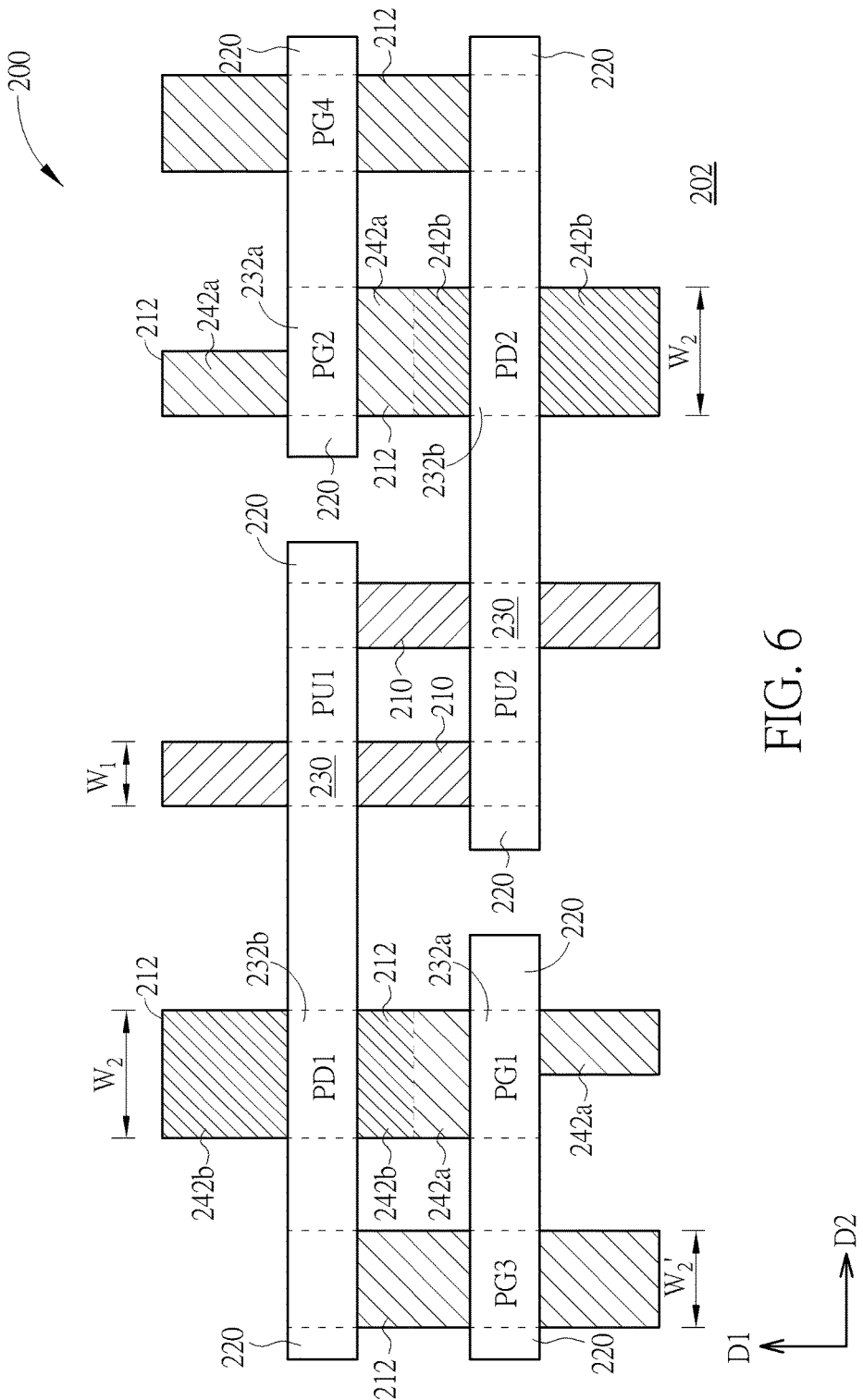
FIG. 6 is a schematic drawing illustrating the 8TDP SRAM cell in a step according to the abovementioned methods provided by the present invention.

Please refer to FIG. 6, which is a schematic drawing illustrating the 8TDP SRAM cell 200 in a step according to the abovementioned methods 10/20 provided by the present invention. According to STEP 12 or STEP 22, the first active regions 210 and the second active region 212 are formed on the substrate 202. As mentioned above, the first active regions 210 include the first conductivity type and the second active regions 212 include the second conductivity type. In the preferred embodiment, widths of the first active regions 210 and the second active region 212 are different from each other, as shown in FIG. 6, but not limited to this. According to STEP 14 or STEP 24, the gate layers 220 are formed on the first active regions 210 to define the first/second pull-up device PU1/PU2, and the gate layers 220 are formed on the second active regions 212 to define the first/second pull-down devices PD1/PD2 and the first/second pass-gate devices PG1/PG2. The gate layers 220 further are formed on other second active regions 212 to define the third pass-gate device PG3 and the fourth pass-gate device PG4. Accordingly, a width $W_1$ of the first active regions 210 of the first/second pull-up devices PU1/PU2 is smaller than a width $W_2'$ of the second active regions 212 of the third/fourth pass-gate devices PG3/PG4. And the width $W_2'$ of the second active regions 212 of the third/fourth pass-gate devices PG3/PG4 is smaller than a width $W_2$ of the second active regions 212 of the first/second pull-down devices PD1/PD2 and of the first/second pass-gate devices PG1/PG2. It should be noted that the first/second pull-up device PU1/PU2 respectively include a channel region 230 formed in the first active region 210 at where the gate layers 220 cover. The first/second pass-gate devices PG1/PG2 respectively include a first channel region 232a formed in the second active regions 210 at where the gate layers 220 cover. And the first/second pull-down devices PD1/PD2 respectively include a second channel region 232b formed in the second active regions 212 at where the gate layers 220 cover. It is noteworthy that dosages of the channel regions 230 of the first/second pull-up devices PU1/PU2 are all the same. And the dosages of the first channel regions 232a of the first/second pass-gate devices PG1/PG2 and the second channel regions 232b of the first/second pull-down devices PD1/PD2 are all the same.

According to STEPS 16-18 or STEPS 26-28, the first pass-gate device PG1 and the second pass-gate device PG2 respectively include first LDDs 242a while the first pull-down device PD1 and the second pull-down device PD2 respectively include second LDDs 242b. As mentioned above, the first LDDs 242a of the pass-gate devices PG1/PG2 and the second LDDs 242b of the pull-down devices PD1/PD2 include the same conductivity type, however the dosage of the first LDDs 242a is different from the dosage of the second LDDs 242b. Specifically, the dosage of the second LDDs 242b is larger than the dosage of the first LDDs 242a.

As mentioned above, thereafter, steps for forming elements of the 8TDP SRAM cell 200 are performed and electrical connection are built, and those details are omitted for brevity. Accordingly, an 8TDP SRAM 200 is obtained. Additionally, the first/second pull-up devices PU1/PU2, the first/second pull-down devices PD1/PD2, and the first/second pass-gate devices PG1/PG2 are formed in between the third pass-gate device PG3 and the fourth pass-gate device PG4. More important, with the additional LDD doping or the separate dopings, the dosage of the second LDDs 242b of the first/second pull-down devices PD1/PD2 is larger than the dosage of the first LDDs 242a of the first/second pass-gate devices PG1/PG2. Consequently, threshold voltages of the first/second pull-down devices PD1/PD2 are lower than threshold voltages of the first/second pass-gate devices PG1/PG2, and thus a current of the first/second pull-down devices PD1/PD2 is higher than a current of the first/second pass-gate devices PG1/PG2. As a result, the beta ratio of current of the pull-down devices PD1/PD2 to current of the pass-gate devices PG1/PG2 is larger than 1. And thus stability and speed of the 8TDP SRAM cell 200 are improved while the current crowding is diminished.

Figure 7:
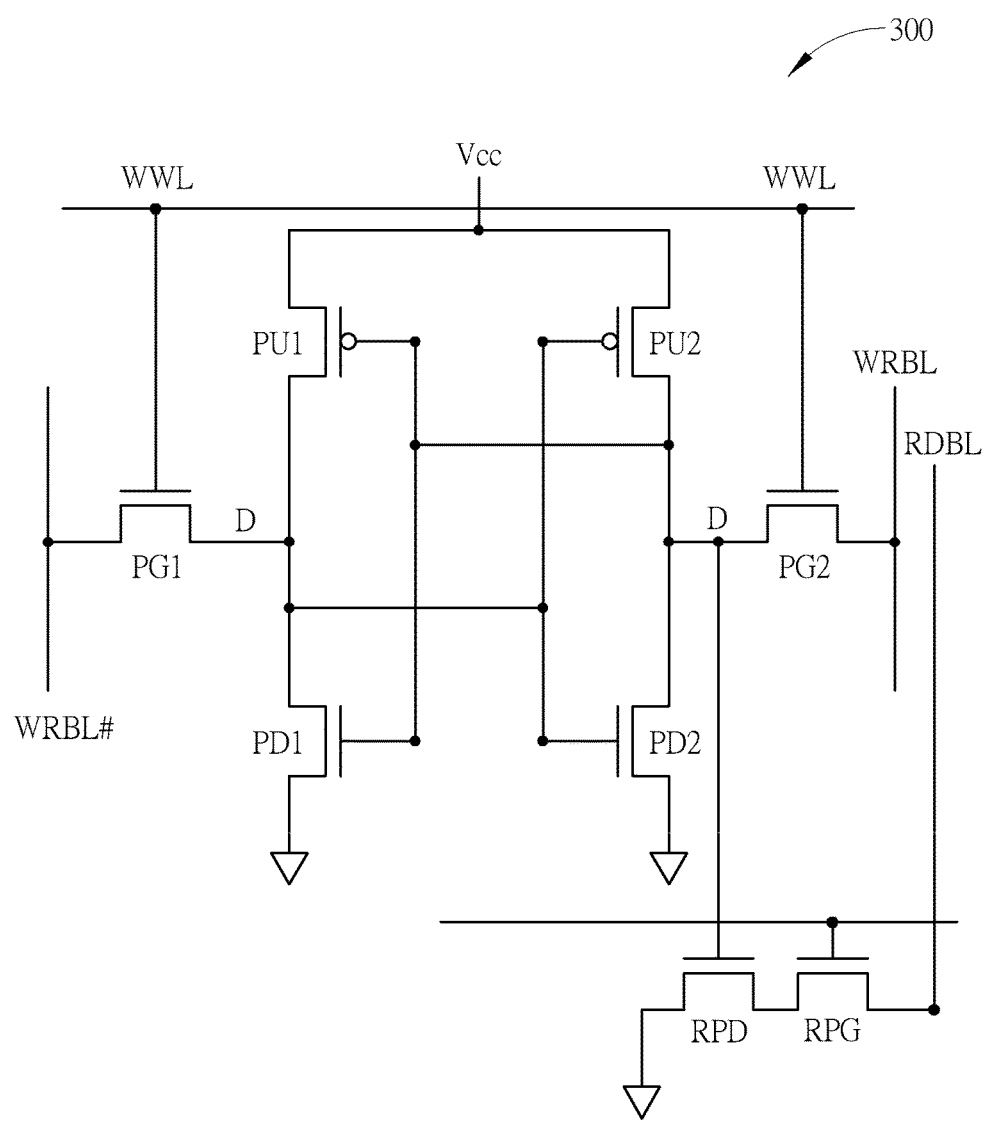
FIG. 7 is a circuit diagram of an 8TRF SRAM cell constructed according to various aspects of the present disclosure in a third preferred embodiment.

Please refer to FIG. 7, which is a circuit diagram of an eight-transistors register file SRAM (hereinafter abbreviated as 8TRF SRAM) cell 300 constructed according to various aspects of the present disclosure in a third preferred embodiment. According to the preferred embodiment, the first pull-up device, the second pull-up device, the first pull-down device, the second pull-down device, the first pass-gate device, the second pass-gate device, a read pull-down device and a read pass-gate device construct the 8TRF SRAM cell 300. In detail, the 8TRF SRAM cell 300 includes the first pass-gate device PG1, the second-pass gate device PG2, the first pull-down device PD1, the second pull-down device PD2, the read pull-down device RPD and the read pass-gate device RPG including the first conductivity type, and the first pull-up device PU1 and the second pull-up device PU2 including the second conductivity type. The first pull-up device PU1, the second pull-up device PU2, the first pull-down device PD1 and the second pull-down device PD2 form a latch. A write word line WWL is electrically connected to the first pass-gate device PG1 and the second pass-gate device PG2 for turning on the first/second pass-gate devices PG1/PG2 when data is to be written into the cell (from write bit lines WRBL, WEBL#), and a read word line RDWL is electrically connected to the read pass-gate device RPG for turning on the read pass-gate device RPG to read the data in the cell based on whether it turns on or off the read pull-down device RPD.

Figure 8:
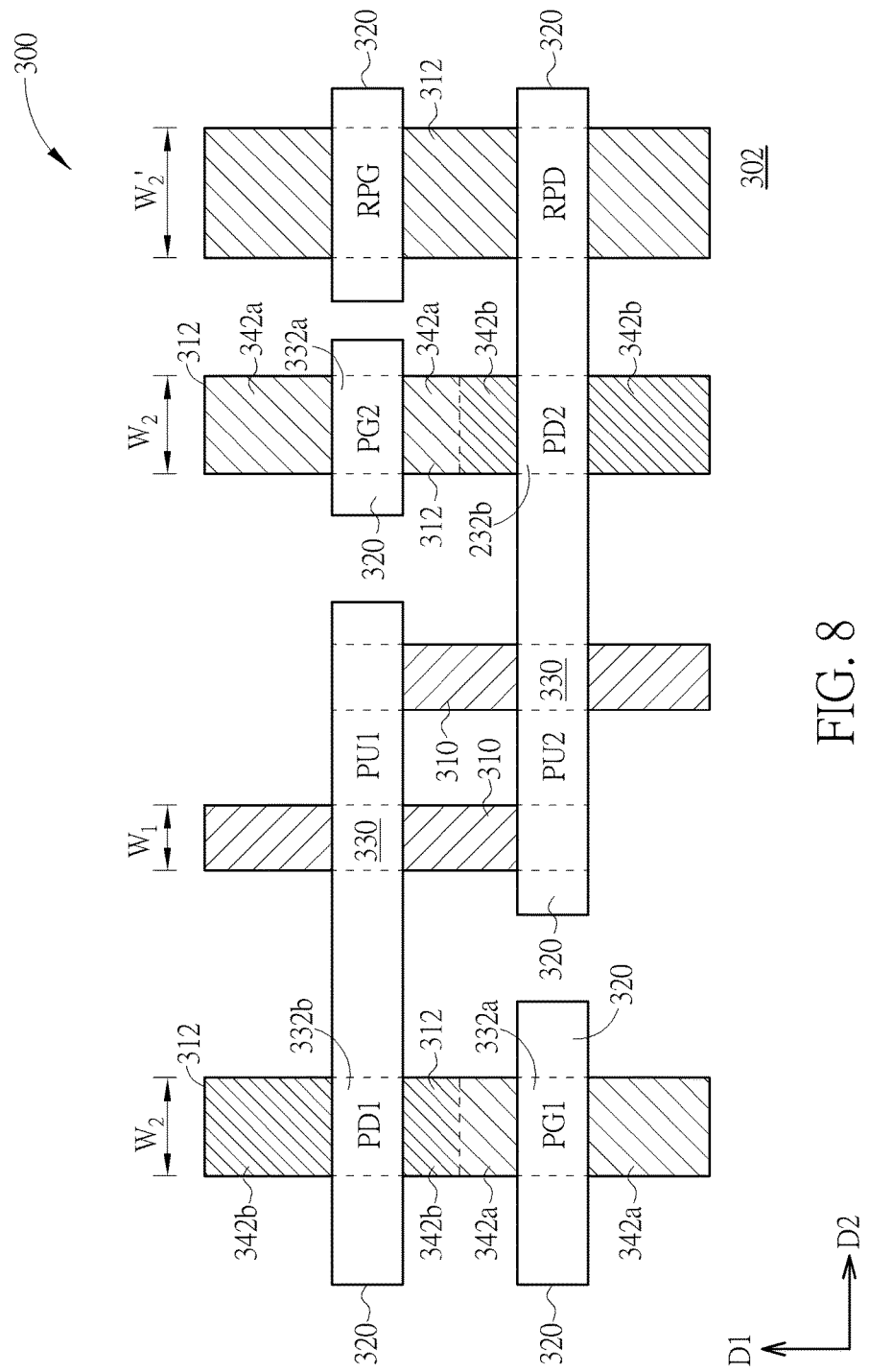
FIG. 8 is a schematic drawing illustrating the 8TRF SRAM cell in a step according to the abovementioned methods provided by the present invention.

Please refer to FIG. 8, which is a schematic drawing illustrating the 8TRF DRAM cell 300 in a step according to the abovementioned methods 10/20 provided by the present invention. According to STEP 12 or STEP 22, the first active regions 310 and the second active region 312 are formed on the substrate 302. As mentioned above, the first active regions 310 include the first conductivity type and the second active regions 312 include the second conductivity type. In the preferred embodiment, widths of the first active regions 310 and the second active region 312 are different from each other, as shown in FIG. 8, but not limited to this. According to STEP 14 or STEP 24, the gate layers 320 are formed on the first active regions 310 to define the first/second pull-up device PU1/PU2, and the gate layers 320 are formed on the second active regions 312 to define the first/second pull-down devices PD1/PD2 and the first/second pass-gate devices PG1/PG2. The gate layers 320 further are formed on another second active region 312 to define the read pass-gate device RPG and a read pull-down device RPD. Accordingly, a width $W_1$ of the first active regions 310 of the first/second pull-up devices PU1/PU2 is smaller than a width $W_2$ of the second active regions 312 of the first/second pull-down devices PD1/PD2 and of the first/second pass-gate devices PG1/PG2. And the width $W_2$ of the second active regions 312 of the first/second pull-down devices PD1/PD2 and of the first/second pass-gate devices PG1/PG2 is smaller than a width $W_2'$ of the second active region 312 of the read pass-gate device RPG and the read pull-down device RPD. It should be noted that the first/second pull-up device PU1/PU2 respectively include a channel region 330 formed in the first active region 310 at where the gate layers 320 cover. The first/second pass-gate devices PG1/PG2 respectively include a first channel region 332a formed in the second active regions 310 at where the gate layers 320 cover. And the first/second pull-down devices PD1/PD2 respectively include a second channel region 332b formed in the second active regions 312 at where the gate layers 320 cover. It is noteworthy that dosages of the channel regions 330 of the first/second pull-up devices PU1/PU2 are all the same. And the dosages of the first channel regions 332a of the first/second pass-gate devices PG1/PG2 and the second channel regions 332b of the first/second pull-down devices PD1/PD2 are all the same.

According to STEPS 16-18 or STEPS 26-28, the first/second pass-gate devices PG1/PG2 respectively include the first LDDs 342a while the first/second pull-down devices PD1/PD2 respectively include the second LDDs 342b. As mentioned above, the first LDDs 342a of the pass-gate devices PG1/PG2 and the second LDDs 342b of the pull-down devices PD1/PD2 include the same conductivity type, however the dosage of the first LDDs 342a is different from the dosage of the second LDDs 342b. Specifically, the dosage of the second LDDs 342b is larger than the dosage of the first LDDs 342a.

As mentioned above, thereafter, steps for forming elements of the 8TRF SRAM cell 300 are performed and electrical connection are built, and those details are omitted for brevity. Accordingly, an 8TRF SRAM 300 is obtained. Additionally, the first/second pull-up devices PU1/PU2, the first/second pull-down devices PD1/PD2, the first/second pass-gate devices PG1/PG2 are formed on a same side of the read pass-gate device RPG and the read pull-down device RPD as shown in FIG. 8. More important, with the additional LDD doping or the separate dopings, the dosage of the second LDDs 342b of the first/second pull-down devices PD1/PD2 is larger than the dosage of the first LDDs 342a of the first/second pass-gate devices PG1/PG2. Consequently, threshold voltages of the first/second pull-down devices PD1/PD2 are lower than threshold voltages of the first/second pass-gate devices PG1/PG2, and thus a current of the first/second pull-down devices PD1/PD2 is higher than a current of the first/second pass-gate devices PG1/PG2. As a result, the beta ratio of current of the pull-down devices PD1/PD2 to current of the pass-gate devices PG1/PG2 is larger than 1. And thus stability and speed of the 8TRF SRAM cell 300 are improved while the current crowding is diminished.

Figure 9:
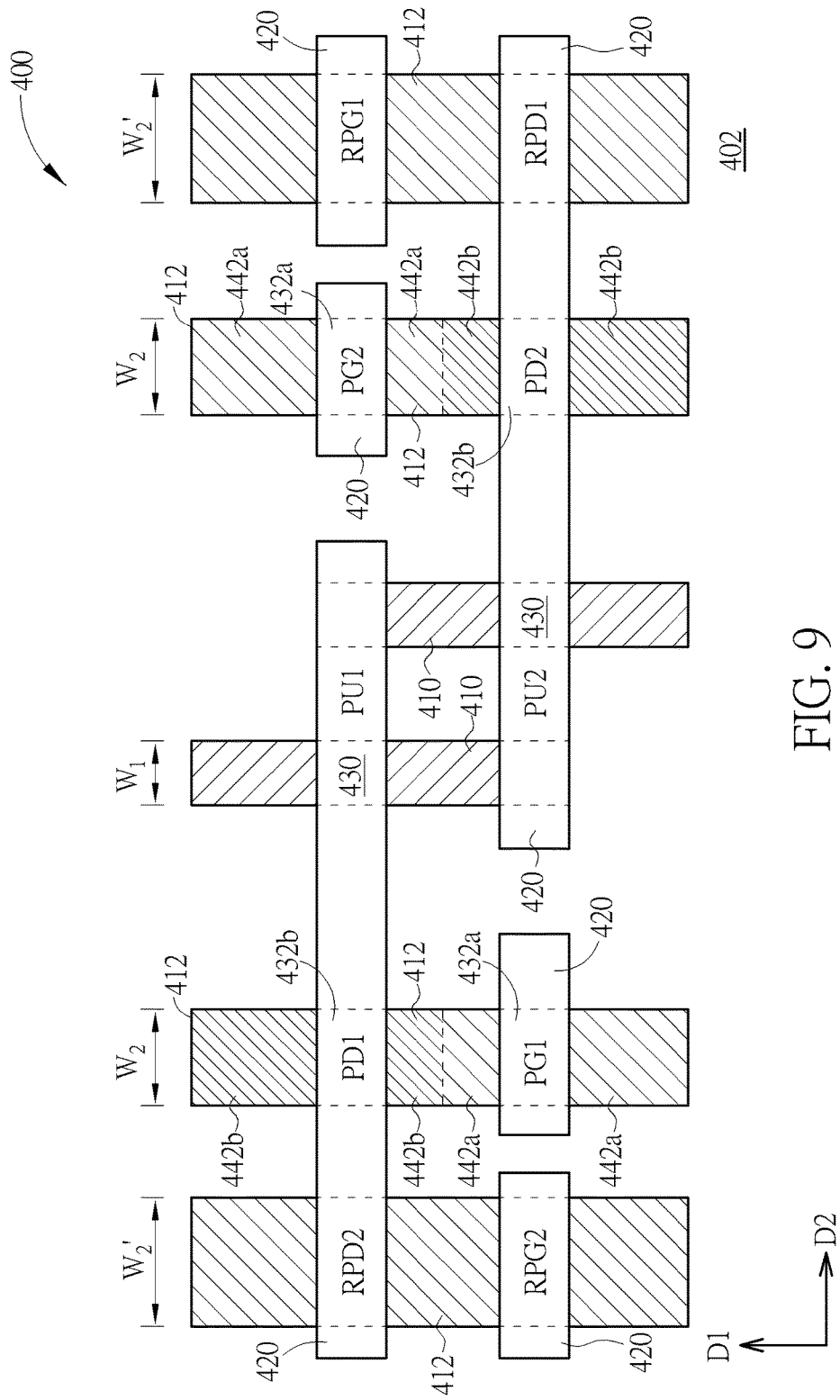
FIG. 9 is a schematic drawing illustrating the 10TRF SRAM cell in a step according to the abovementioned methods provided by a fourth embodiment of the present invention

Please refer to FIG. 9, which is a schematic drawing illustrating a ten transistors register file SRAM (hereinafter abbreviated as 10TRF SRAM) cell 400 in a step according to the abovementioned methods 10/20 provided by a fourth preferred embodiment of the present invention. According to the preferred embodiment, the first pull-up device, the second pull-up device, the first pull-down device, the second pull-down device, the first pass-gate device, the second pass-gate device, a first read pull-down device, a second read pull-down device, a first read pass-gate device, and a second read pass-gate device construct the 10TRF SRAM cell 400. According to STEP 12 or STEP 22, the first active regions 410 and the second active regions 412 are formed on the substrate 402. As mentioned above, the first active regions 410 include the first conductivity type and the second active regions 412 include the second conductivity type. In the preferred embodiment, widths of the first active regions 410 and the second active region 412 are different from each other, as shown in FIG. 9, but not limited to this. According to STEP 14 or STEP 24, the gate layers 420 are formed on the first active regions 410 to define the first/second pull-up device PU1/PU2, and the gate layers 420 are formed on the second active regions 412 to define the first/second pull-down devices PD1/PD2 and the first/second pass-gate devices PG1/PG2. The gate layers 420 further are formed on other second active regions 412 to define the first read pass-gate device RPG1, the second read pass-gate device RPG2, the first read pull-down device RPD1, and the first read pull-down device RPD2. Accordingly, a width $W_1$ of the first active regions 410 of the first/second pull-up devices PU1/PU2 is smaller than a width $W_2$ of the second active regions 412 of the first/second pull-down devices PD1/PD2 and of the first/second pass-gate devices PG1/PG2. And the width $W_2$ of the second active regions 412 of the first/second pull-down devices PD1/PD2 and of the first/second pass-gate devices PG1/PG2 is smaller than a width $W_2'$ of the second active regions 412 of the first/second read pass-gate devices RPG1/RPG2 and the first/second read pull-down devices RPD1/RPD2. It should be noted that the first/second pull-up device PU1/PU2 respectively include a channel region 430 formed in the first active regions 410 at where the gate layers 420 cover. The first/second pass-gate devices PG1/PG2 respectively include a first channel region 432a formed in the second active regions 410 at where the gate layers 420 cover. And the first/second pull-down devices PD1/PD2 respectively include a second channel region 432b formed in the second active regions 412 at where the gate layers 420 cover. It is noteworthy that dosages of the channel regions 430 of the first/second pull-up devices PU1/PU2 are all the same. And the dosages of the first channel regions 432a of the first/second pass-gate devices PG1/PG2 and the second channel regions 432b of the first/second pull-down devices PD1/PD2 are all the same.

According to STEPS 16-18 or STEPS 26-28, the first/second pass-gate devices PG1/PG2 respectively include the first LDDs 442a while the first/second pull-down devices PD1/PD 2 respectively include the second LDDs 442b. As mentioned above, the first LDDs 442a of the pass-gate devices PG1/PG2 and the second LDDs 442b of the pull-down devices PD1/PD2 include the same conductivity type, however the dosage of the first LDDs 442a is different from the dosage of the second LDDs 442b. Specifically, the dosage of the second LDDs 442b is larger than the dosage of the first LDDs 442a.

As mentioned above, thereafter, steps for forming elements of the 10TRF SRAM cell 400 are performed and electrical connection are built, and those details are omitted for brevity. Accordingly, an 10RF SRAM 400 is obtained. More important, with the additional LDD doping or the separate dopings, the dosage of the second LDDs 442b of the first/second pull-down devices PD1/PD2 is larger than the dosage of the first LDDs 442a of the first/second pass-gate devices PG1/PG2. Consequently, threshold voltages of the first/second pull-down devices PD1/PD2 are lower than threshold voltages of the first/second pass-gate devices PG1/PG2, and thus a current of the first/second pull-down devices PD1/PD2 is higher than a current of the first/second pass-gate devices PG1/PG2. As a result, the beta ratio of current of the pull-down devices PD1/PD2 to current of the pass-gate devices PG1/PG2 is larger than 1. And thus stability and speed of the 10TRF SRAM cell 400 are improved while the current crowding is diminished.

According to the SRAM cell and the manufacturing method provided by the present invention, two LDD dopings including equal or different dosages are performed to form the first LDDs for the first pass-gate device and the second pass-gate deice and the second LDDs for the first pull-down device and the second pull-down device. And thus a dosage of the first LDDs is different from a dosage of the second LDDs. By making the dosage of the second LDDs larger than the dosage of the first LDDs, a threshold voltage of the first pull-down device and the second pull-down device is lower than a threshold voltage of the first pass-gate device and the second pass-gate device, and thus a current of the pull-down devices is higher than a current of the pass-gate devices. As a result, the beta ratio of current of the pull-down devices to current of the pass-gate devices is larger than 1. And thus stability and speed of the SRAM cell are improved while the current crowding is diminished. Furthermore, the SRAM cell can be a 6T-SRAM cell, a 8TDP SRAM cell, a 8TRF SRAM cell, and a 10TRF SRAM cell according to the present invention. In other words, the SRAM cell and the manufacturing method provided by the present further render improved applicability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) cell comprising:
   a first pass-gate device and a second-pass gate device comprising a first conductivity type, and the first pass-gate device and the second pass-gate device respectively comprising a gate layer and first lightly-doped drains (LDDs) formed at two sides of the gate layer, and the first LDDS comprising the first conductivity type;
   a first pull-down device and a second pull-down device comprising the first conductivity type, and the first pull-down device and the second pull-down device respectively comprising a gate layer and second LDDs formed at two sides of the gate layer, and the second LDDS comprising the first conductivity type; and
   a first pull-up device and a second pull-up device comprising a second conductivity type complementary to the first conductivity type, wherein a dosage of the first LDDs is different from a dosage of the second LDDs, and a threshold voltage of the first pull-down device and the second pull-down device is lower than a threshold voltage of the first pass-gate device and the second pass-gate device.

2. The SRAM cell according to claim 1, wherein the first pass-gate device and the second pass-gate device respectively comprise a first channel region, the first pull-down device and the second pull-down device respectively comprise a second channel region, and a dosage of the first channel region and a dosage of the second channel region are the same.

3. The SRAM cell according to claim 1, wherein the first pull-up device, the second pull-up device, the first pull-down device, the second pull-down device, the first pass-gate device, and the second pass-gate device construct a 6T-SRAM.

4. The SRAM cell according to claim 3, wherein a width of an active region of the first pull-up device, the second pull-up device, the first pull-down device, the second pull-down device, the first pass-gate device, and the second pass-gate device are the same.

5. The SRAM cell according to claim 1, further comprising a third pass-gate device and a fourth pass-gate device.

6. The SRAM cell according to claim 5, wherein the first pull-up device and the second pull-up device respectively comprise a first active region, the first pull-down device, the second pull-down device, the first pass-gate device, and the second pass-gate device respectively comprise a second active region, the third pass-gate device and the fourth pass-gate device respectively comprise a third active region, and widths of the first active regions, the second active regions, and the third active regions are different from each other.

7. The SRAM cell according to claim 5, wherein the first pull-up device and the second pull-up device, the first pull-down device, the second pull-down device, the first pass-gate device, and the second pass-gate device are formed in between the third pass-gate device and the fourth pass-gate device to construct an 8T-dual port SRAM.

8. The SRAM cell according to claim 1, further comprising a first read pass-gate device and a first read pull-down device.

9. The SRAM cell according to claim 8, wherein the first pull-up device and the second pull-up device respectively comprise a first active region, the first pull-down device, the second pull-down device, the first pass-gate device, and the second pass-gate device respectively comprise a second active region, the first read pass-gate device and the first read pull-down device respectively comprise a third active region, and widths of the first active regions, the second active regions, and the third active regions are different from each other.

10. The SRAM cell according to claim 8, wherein the first pull-up device, the second pull-up device, the first pull-down device, the second pull-down device, the first pass-gate device and the second pass-gate device are formed on a same side of the first read pass-gate device and the first read pull-down device to construct an 8T register file SRAM.

11. The SRAM cell according to claim 8, further comprising a second read pass-gate device and a second read pull-down device, and the first pull-up device, the second pull-up device, the first pull-down device, the second pull-down device, the first pass-gate device, the second pass-gate device, the first read pass-gate device, the second read pass-gate device, the first read pull-down device, and the second read pull-down device construct a 10T register file SRAM.

12. The SRAM cell according to claim 11, wherein the first pull-up device and the second pull-up device respectively comprise a first active region, the first pull-down device, the second pull-down device, the first pass-gate device, and the second pass-gate device respectively comprise a second active region, the first read pass-gate device, the second read pass-gate device, the first read pull-down device, and the second read pull-down device respectively comprise a third active region, and widths of the first active regions, the second active regions, and the third active regions are different from each other.

13. A method for manufacturing a SRAM cell, comprising:
   providing a substrate comprising a plurality of active regions formed thereon, the active regions being extended along a first direction and arranged along a second direction;
   forming a plurality of gate layers crossing the active regions to define a first pull-up device, a second pull-up device, a first pull-down device comprising a first conductivity type, a second pull-down device comprising the first conductivity type, a first pass-gate device comprising the first conductivity type and a second pass-gate device comprising the first conductivity type;
   performing a first LDD doping to the first pass-gate device and the second pass gate device to form first LDDs at two sides of the gate layer of the first pass-gate device and at two sides of the gate layer of the second pass-gate device, and the first LDD doping comprising the first conductivity type; and
   performing a second LDD doping after the first LDD doping to the first pull-down device and the second pull-down device to form second LDDs at two sides of the gate layer of the first pull-down device and at two sides of the gate layer of the second pull-down device, the second LDD doping comprising the first conductivity type, and a dosage of the second LDD doping being equal to or larger than a dosage of the first LDD doping.

14. The method for manufacturing the SRAM cell according to claim 13, wherein the dosage of the first LDD doping is 1E14-1E15 cm$^{-2}$.

15. The method for manufacturing the SRAM cell according to claim 14, wherein the first LDD doping is also performed to the first pull-down device and the second pull-down device.

16. The method for manufacturing the SRAM cell according to claim 14, wherein the second LDD doping comprises arsenic (As), and a dosage of the second LDD doping is 1E14-1E15 cm$^{-2}$.

17. The method for manufacturing the SRAM cell according to claim 14, wherein the first pull-down device and the second pull-down device are protected from the first LDD doping, and the second LDD doping comprises As, a dosage of the second LDD doping is 2E14-2E15 cm$^{-2}$.

18. The method for manufacturing the SRAM cell according to claim 13, wherein the second LDD doping comprises solid phase diffusion.

19. The method for manufacturing the SRAM cell according to claim 13, wherein the active regions comprise first active regions comprising the first conductivity type and second active regions comprising a second conductivity type, the second conductivity type being complementary to the first conductivity type, dosages of the first active regions are the same, and dosages of the second active region are the same.

* * * * *